(12) United States Patent
Ogimoto

(10) Patent No.: US 6,557,246 B2
(45) Date of Patent: May 6, 2003

(54) PART MOUNTING DEVICE AND PART MOUNTING METHOD

(75) Inventor: Shinichi Ogimoto, Ebina (JP)

(73) Assignee: Shibaura Mechatronics Corporation, Yokohama (JP)

( * ) Notice: Subject to any disclaimer, the term of this patent is extended or adjusted under 35 U.S.C. 154(b) by 0 days.

(21) Appl. No.: 09/889,564

(22) PCT Filed: Nov. 29, 2000

(86) PCT No.: PCT/JP00/08400

§ 371 (c)(1),
(2), (4) Date: Jul. 30, 2001

(87) PCT Pub. No.: WO01/41523

PCT Pub. Date: Jun. 7, 2001

(65) Prior Publication Data

US 2002/0128745 A1 Sep. 12, 2002

(30) Foreign Application Priority Data

Nov. 29, 1999 (JP) .......................................... 11-337556

(51) Int. Cl.[7] ................................................ B23P 19/00
(52) U.S. Cl. .............................. 29/739; 29/759; 29/783; 700/213
(58) Field of Search .......................... 29/739, 740, 759, 29/783; 700/213

(56) References Cited

U.S. PATENT DOCUMENTS

| 5,400,502 A | * | 3/1995 | Ota et al. .................. 29/564.1 |
| 5,499,443 A | | 3/1996 | Ota et al. |
| 5,509,192 A | * | 4/1996 | Ota et al. ..................... 29/703 |
| 6,370,764 B1 | * | 4/2002 | Kinoshita et al. ............. 29/721 |
| 6,370,765 B1 | * | 4/2002 | Hiramoto et al. ............. 29/740 |
| 6,389,683 B1 | * | 5/2002 | Mori et al. ................... 29/740 |

FOREIGN PATENT DOCUMENTS

| JP | 10-12662 | 1/1998 |
| JP | 10-200294 | 7/1998 |
| JP | 11-261214 | 9/1999 |

* cited by examiner

Primary Examiner—Khoi H. Tran
(74) Attorney, Agent, or Firm—Oblon, Spivak, McClelland, Maier & Neustadt, P.C.

(57) ABSTRACT

A part mounting system requires a relatively small floor space for installation. A bonding apparatus (50) includes a temporary-bonding unit (51) that bonds a plurality of FPCs to which ACFs are attached, respectively, successively to a glass substrate positioned by an aligning apparatus (40), and a permanent-bonding unit (52) that bonds the plurality of FPCs temporarily bonded to the glass substrate simultaneously by heating. Each of the temporary-bonding unit (51) and the permanent-bonding unit (52) has a pair of pressing devices respectively for pressing the glass substrate and the FPC from above and from below the glass substrate. Each pressing device is capable of selectively applying either a bonding pressure or a backup pressure to the glass substrate and the electronic part.

14 Claims, 11 Drawing Sheets

FIG. I

PART MOUNTING DEVICE AND PART MOUNTING METHOD

TECHNICAL FIELD

The present invention relates to a part mounting system for mounting electronic parts on a substrate and a part mounting method. More particularly, the present invention relates to a part mounting system that mounts electronic parts on a substrate by pressing the same through connecting members against the substrate, and a part mounting method.

BACKGROUND ART

A known part mounting system for use in fabricating a flat panel display, such as a liquid crystal display, bonds electronic parts, such as flexible printed circuits (abbreviated to "FPCs"), to a substrate, such as a glass substrate, by pressing the electronic parts through connecting members, such as anisotropic conductive films (abbreviated to "ACFs"), against the substrate.

There is a growing tendency for the size of panels of flat panel displays fabricated by using such a part mounting system to increase. Generally, a plurality of FPCs are attached by bonding to both first and second surfaces of a glass substrate. A conventional part mounting system has an upper bonding unit that presses an FPC against a glass substrate from above the glass substrate and a lower bonding unit that presses an FPC against the same glass substrate from below the glass substrate. The upper and the lower bonding unit are disposed at different positions, respectively, beside a glass substrate carrying path. The glass substrate is aligned with the upper bonding unit when attaching an FPC to the first surface of the glass substrate or with the lower bonding unit when attaching an FPC to the second surface of the glass substrate, and then the FPC is pressed against and attached to the glass substrate one at a time.

This conventional part mounting system attaches FPCs to the first and the second surface of the glass substrate by bonding by using the upper and the lower bonding unit disposed respectively at the different positions. Therefore, the conventional part mounting system needs a large floor space for installation.

DISCLOSURE OF THE INVENTION

The present invention has been made in view of this problem and it is therefore an object of the present invention to provide a part mounting system that needs a relatively small floor space for installation, and a part mounting method.

According to a first aspect of the present invention, a part mounting system comprises: an electronic part carrying apparatus that carries an electronic part; a substrate feed apparatus that feeds a substrate; an aligning apparatus that aligns an electronic part carried by the electronic part carrying apparatus and a substrate fed by the substrate feed apparatus; and a bonding apparatus that bonds the electronic part aligned with the substrate to the substrate by pressing; wherein the bonding apparatus includes a first pressing unit that presses the electronic part against an upper surface of the substrate from above the substrate, and a second pressing unit that presses the electronic part against a lower surface of the substrate from below the substrate, each of the first and the second pressing unit has a tool that is applied to the substrate and the electronic part, and a pressure applying device that selectively applies a bonding pressure or a backup pressure to the tool.

In the part mounting system in the first aspect of the present invention, it is preferable that the pressure applying device includes a pair of lifting devices that apply the bonding pressure or the backup pressure to the tool, and a pressure adjusting device that adjusts a pressure to be exerted by the lifting devices on the tool.

According to a second aspect of the present invention, a part mounting method comprises the steps of: feeding an electronic part; feeding a substrate; aligning the fed electronic part and the fed substrate; and bonding the electronic part aligned with the substrate through a connecting member to the substrate; wherein the step of bonding the electronic part to the substrate includes the steps of: selecting either a first pressing unit that presses the electronic part against an upper surface of the substrate from above the substrate or a second pressing unit that presses the electronic part against a lower surface of the substrate from below the substrate to bond the electronic part to the substrate on the basis of electronic part mounting information stored in a storage device; and applying a bonding pressure to a tool included in the pressing unit selected for bonding the electronic part to the substrate and applying a backup pressure to a tool included in the other bonding unit.

The part mounting system according to the present invention is provided with the bonding apparatus including the pair of pressing units that press electronic parts against the upper and the lower surface of a substrate, and either the bonding pressure or the backup pressure can be selectively applied to each of the pressing units. Therefore, only the pair of bonding units is necessary for attaching electronic parts by bonding to both the surfaces of the substrate and hence the part mounting system needs a relatively small floor space for installation. Since the pressure applying device has the pair of lifting devices for applying the bonding pressure or the backup pressure to the tool, and the pressure adjusting device for adjusting a pressure to be exerted by the lifting devices, an optimum pressure can be used for bonding according to the type of electronic parts or the number of electronic parts to be simultaneously bonded to the substrate.

BEST MODE FOR CARRYING OUT THE INVENTION

Figure 11:
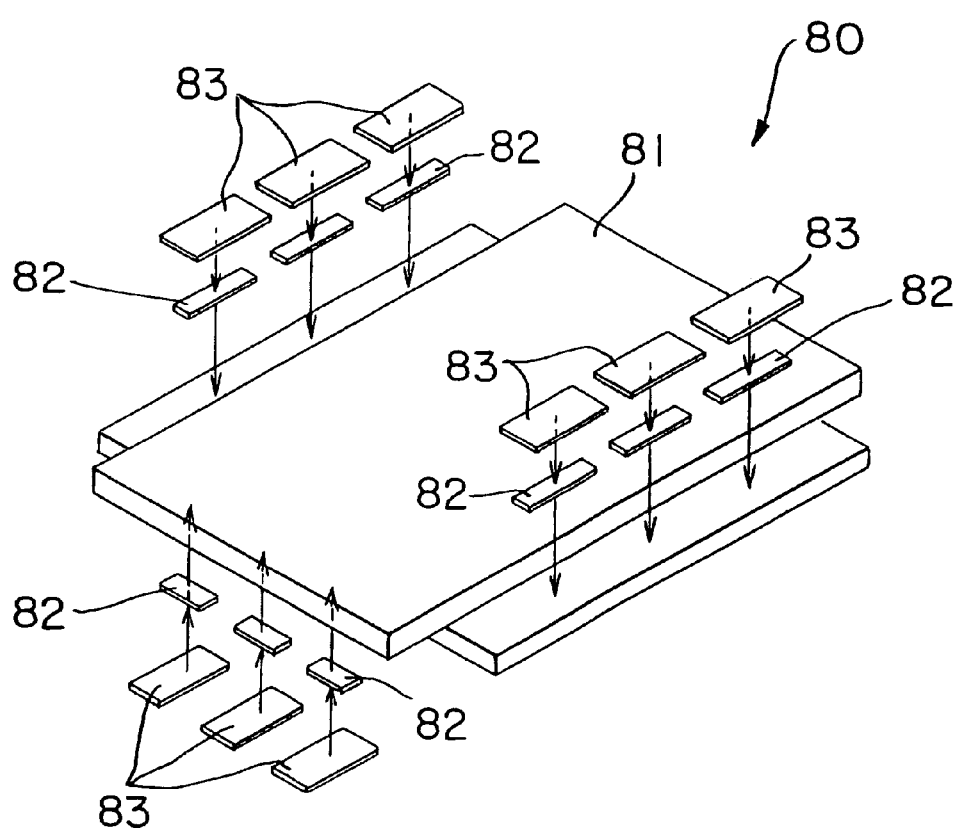
FIG. 11 is a perspective view of a liquid crystal display to be fabricated by using a part mounting system.

A preferred embodiment of the present invention will be described hereinafter with reference to the accompanying drawings. The embodiment will be described as applied to fabricating a liquid crystal display by bonding FPCs (electronic parts) to a glass substrate (substrate) through ACFs (connecting members). As shown in FIG. 11, a liquid crystal display 80 to be fabricated by using a part mounting system in a preferred embodiment of the present invention has a glass substrate 81, and a plurality of FPCs 83 bonded through ACFs 82 to the upper and lower surface of the glass substrate 81.

Figure 1:
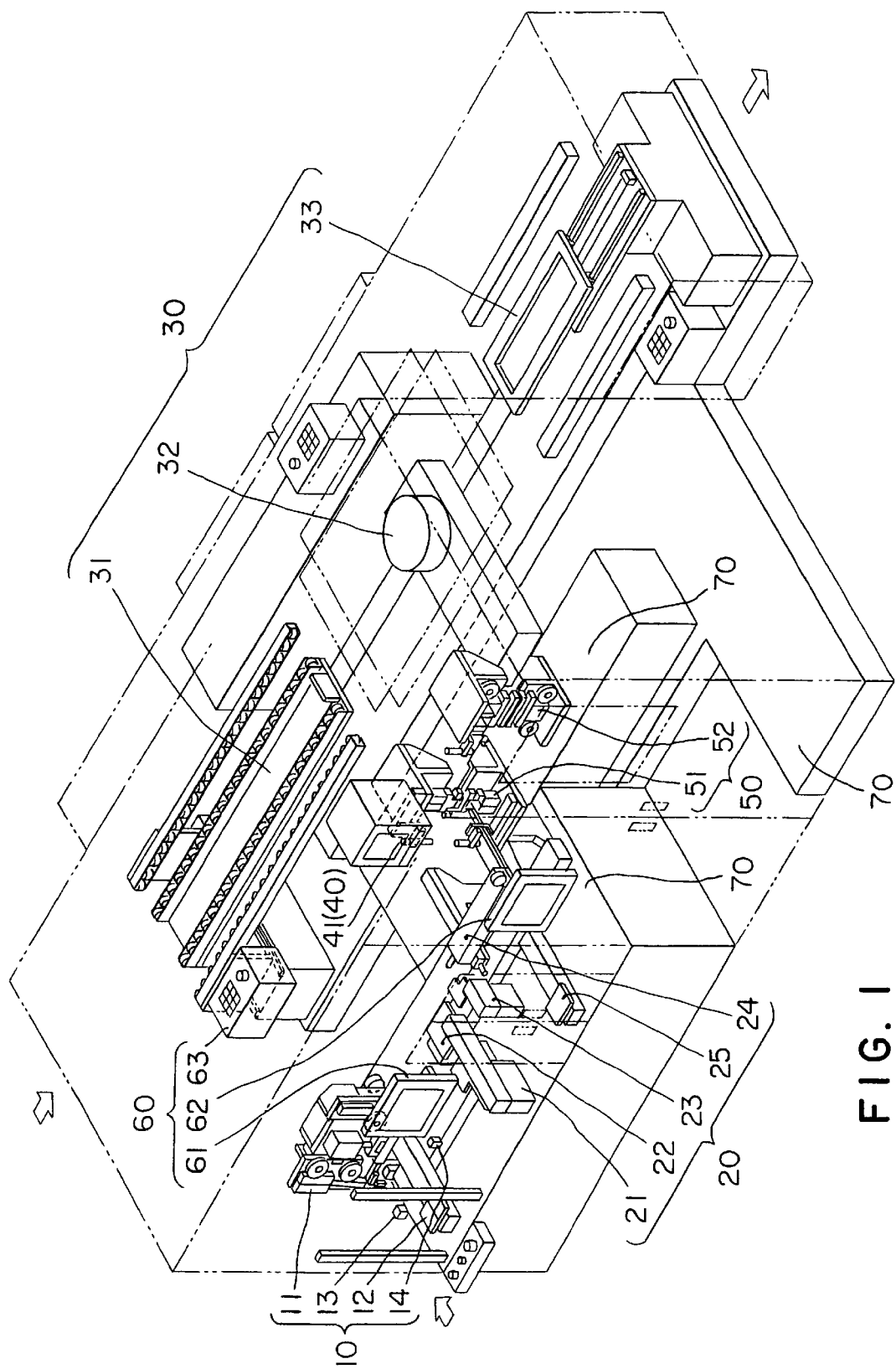
FIG. 1 is a schematic perspective view of a part mounting system in a preferred embodiment of the present invention.

Referring to FIG. 1 showing the part mounting system in the preferred embodiment in a schematic perspective view, the part mounting system includes an ACF applying apparatus (connecting member applying apparatus) 10 that applies an ACF to an FPC, an FPC carrying apparatus 20 for carrying an FPC with an ACF attached thereto, a glass substrate feed apparatus 30 that feeds a glass substrate, an aligning apparatus 40 for aligning the glass substrate fed thereto by the glass substrate feed apparatus 30 and the FPC carried thereto by the FPC carrying apparatus 20, a bonding apparatus 50 for pressure-bonding the FPC through the ACF to the glass substrate aligned with the FPC, and a man-machine interface apparatus 60 for assistance for an operator to give instructions to the ACF applying apparatus 10, the FPC carrying apparatus 20, the glass substrate feed apparatus 30, the aligning apparatus 40 and the bonding apparatus 50. The ACF applying apparatus 10, the FPC carrying apparatus 20, the glass substrate feed apparatus 30, the aligning apparatus 40, the bonding apparatus 50 and the man-machine interface apparatus 60 are mounted on a base 70 to constitute a single system.

The ACF applying apparatus 10 includes an ACF applying unit 11 that applies an ACF to an FPC and an FPC feed stage (electronic part feed device)12 that feeds an FPC to the ACF applying unit 11. The ACF applying apparatus 10 has an FPC identifying unit 13 capable of identifying the type and the positional state, which is represented by inclination and direction of surfaces, of an FPC fed by the FPC feed stage 12 to prevent the feed of a wrong FPC due to an erroneous operator's operation or feed of an FPC with a wrong surface facing up. The ACF applying apparatus 10 has an ACF application state examining unit 14 capable of quantitatively deciding the state of an ACF applied to an FPC by the ACF applying unit 11 to prevent the reduction of yield by avoiding quality variation due to the visual examination of the state of the ACF on the FPC by the operator.

The FPC carrying apparatus 20 has an FPC transfer arm 21 and an FPC transfer stage 22. The FPC transfer arm 21 receives an FPC from the FPC feed stage 12 of the ACF applying apparatus 10 and transfers the same to the FPC transfer stage 22. The FPC transfer stage 22 transfers the FPC to an FPC carrying unit 24. The FPC carrying apparatus 20 has an FPC inverting unit (inverting mechanism) 23 capable of inverting an FPC received from the FPC transfer stage 22. The FPC inverting unit 23 sets an FPC with a surface thereof facing a direction required by the bonding apparatus 50 (with the right surface facing the right direction). An FPC inverted by the FPC inverting unit 23 is transferred to the FPC carrying unit 24. The FPC carrying apparatus 20 includes the FPC carrying unit 24 that receives an FPC from the FPC transfer stage 22 or the FPC inverting unit 23 to the bonding apparatus 50 (aligning apparatus 40), and an FPC feed table 25 for refeeding an FPC to the bonding apparatus 50 (aligning apparatus 40). An FPC feed operation of the FPC carrying apparatus 20 for carrying an FPC from the ACF applying apparatus 10 to the bonding apparatus 50 (aligning apparatus 40) is carried out automatically without the attendance of the operator to prevent the reduction of yield by avoiding troubles, such as short circuit between terminals due to the adhesion of dust to the FPC, and to prevent feeding an FPC with a wrong surface thereof facing a specific direction in which a right surface is to face to the bonding apparatus 50 (aligning apparatus 40).

The glass substrate feed apparatus 30 has a glass substrate supply unit 31 that supplies a glass substrate, a glass substrate carrying stage 32 capable of moving in X, Y and θ directions and of carrying a glass substrate received from the glass substrate supply unit 31, a glass substrate transfer unit, not shown, that receives a glass substrate from the glass substrate carrying stage 32, and a glass substrate delivery unit 33 that receives a glass substrate from the glass substrate transfer unit and delivers the same to a delivery position. A glass substrate is transferred automatically from the glass substrate supply unit 31 to the glass substrate carrying stage 32 and from the glass substrate carrying stage 32 to the glass substrate delivery stage 33 without operator's attendance. The glass substrate supply unit 31 may be provided with a glass substrate positioning unit, not shown, for positioning a glass substrate to transfer the glass substrate accurately to the glass substrate carrying stage 32.

Figure 2:
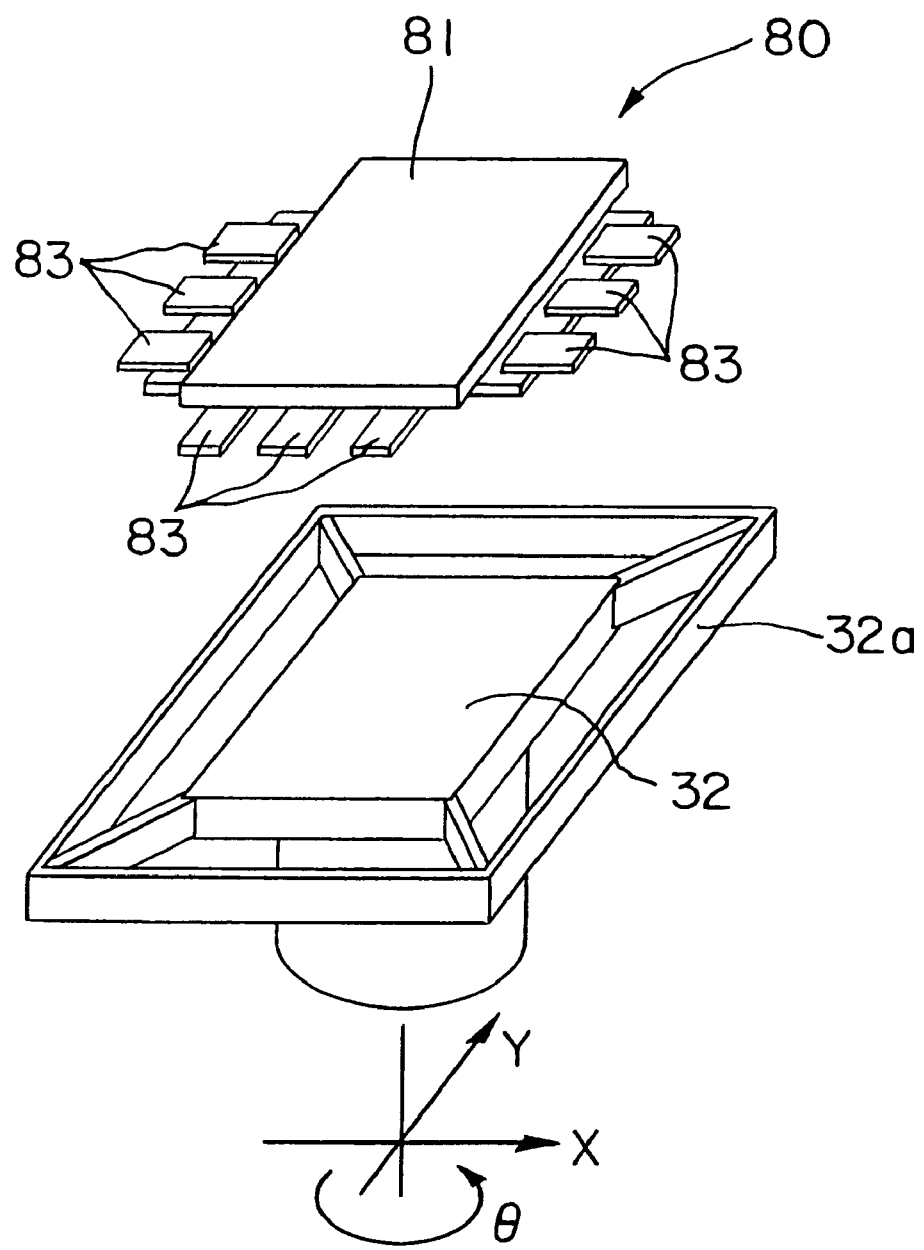
FIG. 2 is a perspective view of a modification of a glass substrate carrying stage included in a glass substrate feed apparatus shown in FIG. 1.

FIG. 2 shows a glass substrate carrying stage 32 in a modification of the glass substrate carrying stage 32. As shown in FIG. 2, the glass substrate carrying stage 32 may be surrounded by an FPC support mechanism 32a, and FPCs 83 to be bonded to a glass substrate 81 placed on the glass substrate carrying stage 32 may be supported on the FPC support mechanism 32a. Thus, it is possible to prevent the FPCs 83 from drooping and interfering with other units and falling off the glass substrate 81, which effectively prevents delay in supplying and delivering the glass substrate 81.

The aligning apparatus 40 has an image pickup device 41 that forms an image of a glass substrate placed on the glass substrate carrying stage 32 of the glass substrate feed apparatus 30 and an FPC carried by the FPC carrying unit 24 of the FPC carrying apparatus 20. The aligning apparatus 40 has an image processing device, not shown, that recognizes the position of the glass substrate and the positional relation between the glass substrate and the FPC from an image formed by the image pickup device 41. The aligning apparatus 40 corrects the respective positions of the glass substrate carrying stage 32 and the FPC carrying unit 24 on the basis of the result of recognition made by the image processing device. The position of the glass substrate carrying stage 32 is corrected on the basis of the position of the glass substrate recognized by the image processing device and the position of the FPC carrying unit 24 is corrected on the basis of the positional relation between the glass substrate and the FPC recognized by the image processing device to align the glass substrate and the FPC. This aligning method is capable of achieving the alignment of the glass substrate and the FPC in a high accuracy as compared with that in which the glass substrate and the FPC can be aligned by a conventional aligning method using mechanical means, such as gauging. The positional relation between the glass substrate and the FPC may be corrected by correcting the position of the glass substrate carrying stage 32.

The bonding apparatus 50 has a temporary bonding unit (temporary-bonding device) 51 that bonds successively a plurality of FPCs provided with ACFs for temporary bonding to a glass substrate correctly positioned by the aligning apparatus 40, and a permanent-bonding unit (permanent-bonding device) 52 that heats and presses simultaneously the plurality of FPCs temporarily bonded to the glass substrate for permanent bonding.

Figure 3:
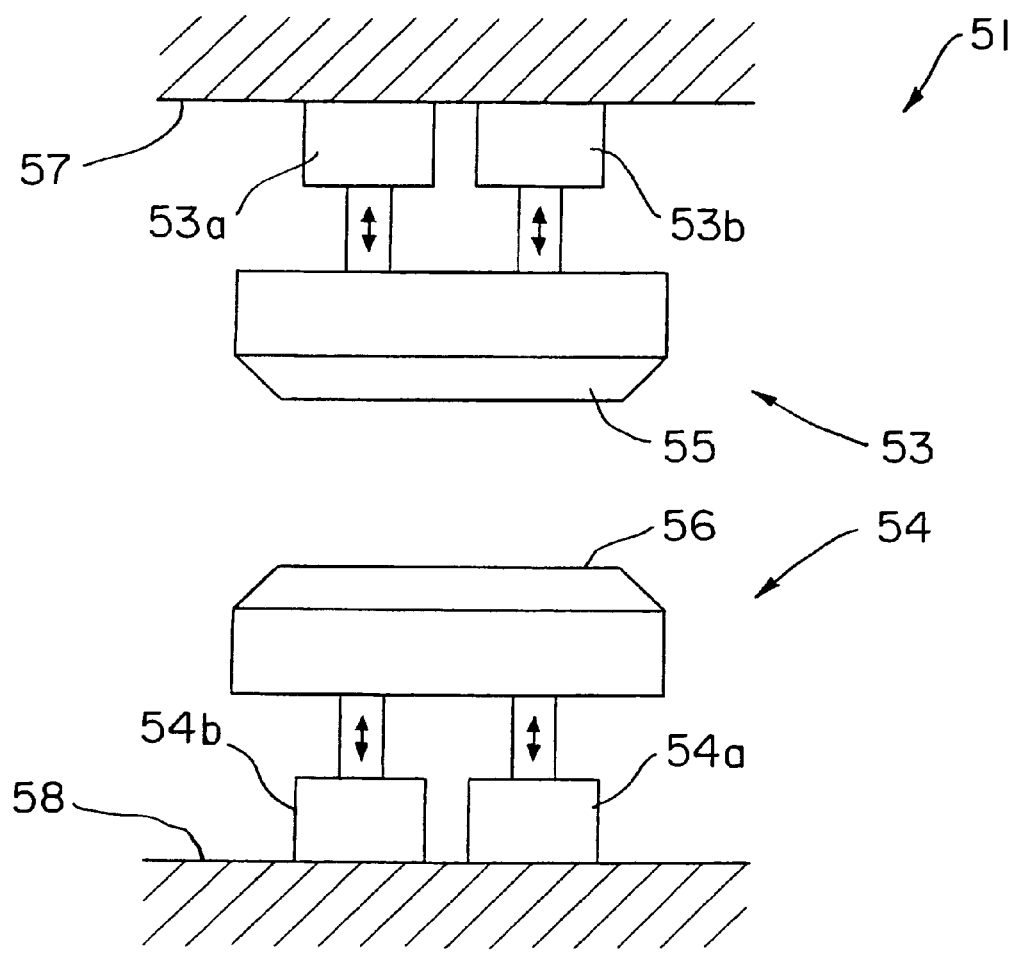
FIG. 3 is a typical view of assistance in explaining a bonding apparatus shown in FIG. 1.

FIG. 3 is a typical view of the temporary-bonding unit 51 shown in FIG. 1. As shown in FIG. 3, the temporary-bonding unit 51 has a first pressing device 53 that applies a pressure from above a glass substrate and an FPC, and a second pressing device 54 that applies a pressure from below a glass substrate and an FPC. The first pressing device 53 has an upper tool 55 that is brought into contact with the upper surfaces of the glass substrate and the FPC, and a pair of cylinder actuators (lifting devices) 53a and 53b. The cylinder actuator 53a applies a temporary-bonding pressure to the upper tool 55, and the other cylinder actuator 53b applies a backup pressure to the upper tool 55. The second pressing device 54 has a lower tool 56 that is brought into contact with the lower surfaces of the glass substrate and the FPC, and a pair of cylinder actuators (lifting devices) 54a and 54b. The cylinder actuator 54a applies a temporary-bonding pressure to the lower tool 56, and the other cylinder actuator 54b applies a backup pressure to the lower tool 56. The upper tool 55 and the lower tool 56 are disposed opposite to each other. The cylinder actuators 53a and 53b are fixed to an upper setting surface 57, and the cylinder actuators 54a and 54b are fixed to a lower setting surface 58. The cylinder actuators 53a and 53b (54a and 54b) and pressure adjusting devices 73, which will be described later, constitute a pressure applying device.

When temporarily bonding an FPC to the upper surface of a glass substrate by the temporary bonding unit 51, the lower cylinder actuator 54b, which applies the backup pressure to the lower tool 56, raises the lower tool 56 to a backup position, and the upper cylinder actuator 53a, which applies the temporary-bonding pressure to the upper tool 55, lowers the upper tool 55 to a pressing position. When temporarily bonding an FPC to the lower surface of a glass substrate by the temporary-bonding unit 51, the upper cylinder actuator 53b, which applies the backup pressure to the upper tool 55, lowers the upper tool 55 to a backup position, and the lower cylinder actuator 54a, which applies the temporary-bonding pressure to the lower tool 56, raises the lower tool 56 to a pressing position. The backup pressure to be applied to the upper tool 55 and the lower tool 56 by the cylinder actuators 53b and 54b is higher than the temporary-bonding pressure to be applied to the upper tool 55 and the lower tool 56 by the cylinder actuators 53a and 54a. The cylinder actuators 53b and 54b for backup may be provided with locking mechanisms to produce a pressure (reaction force) corresponding to the pressure exerted by the cylinder actuators 53a and 54a for temporary bonding.

Figure 4:
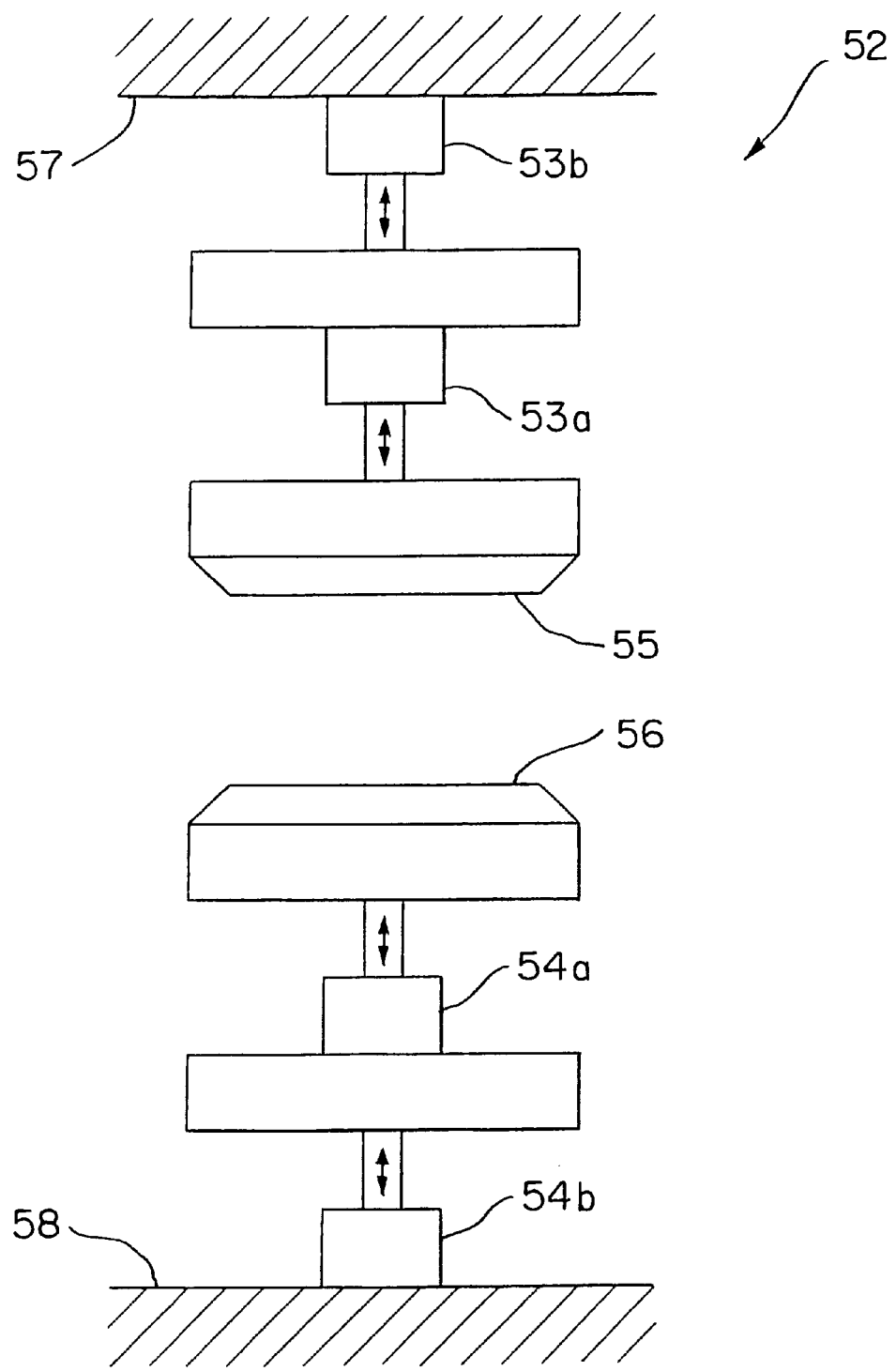
FIG. 4 is a typical view of assistance in explaining a modification of the bonding apparatus shown in FIG. 3.

The permanent-bonding unit 52 shown in FIG. 1 may be the same in construction as the temporary-bonding unit 51 shown in FIG. 3. In the temporary-bonding unit 51 shown in FIG. 3, the cylinder actuators 53a and 53b are disposed in a parallel arrangement with respect to the upper tool 55, and the cylinder actuators 54a and 54b are disposed in a parallel arrangement with respect to the lower tool 56. The cylinder actuators 53a and 53b may be disposed in a series arrangement with respect to the upper tool 55, and the cylinder actuators 54a and 54b may be disposed in a series arrangement with respect to the lower tool 56 as shown in FIG. 4. The bonding apparatus 50 may be further provided with pressure adjusting devices 73 (FIG. 5), such as electropneumatic regulators, to adjust the temporary-bonding pressure and the permanent-bonding pressure according to the type of FPCs and the number of FPCs that are pressed simultaneously for permanent bonding. The electropneumatic regulators or the like may be properly controlled by the operator or may be controlled by a controller on the basis of information about the types of glass substrates and FPCs. In FIGS. 3 and 4, more than two cylinder actuators may be used for operating each of the tools 55 and 56. Each of the tools 55 and 56 may be operated by a single cylinder actuator capable of exerting variable pressure to the tool 55 or 56.

The man-machine interface apparatus 60 has touch-sensitive panels 61 and 62 for controlling the operations of the ACF applying apparatus 10 and the FPC carrying apparatus 20, and a control panel 63 for controlling the operation of the glass substrate feed apparatus 30. The control panel 63 is provided with push-button switches for various functions.

Figure 5:
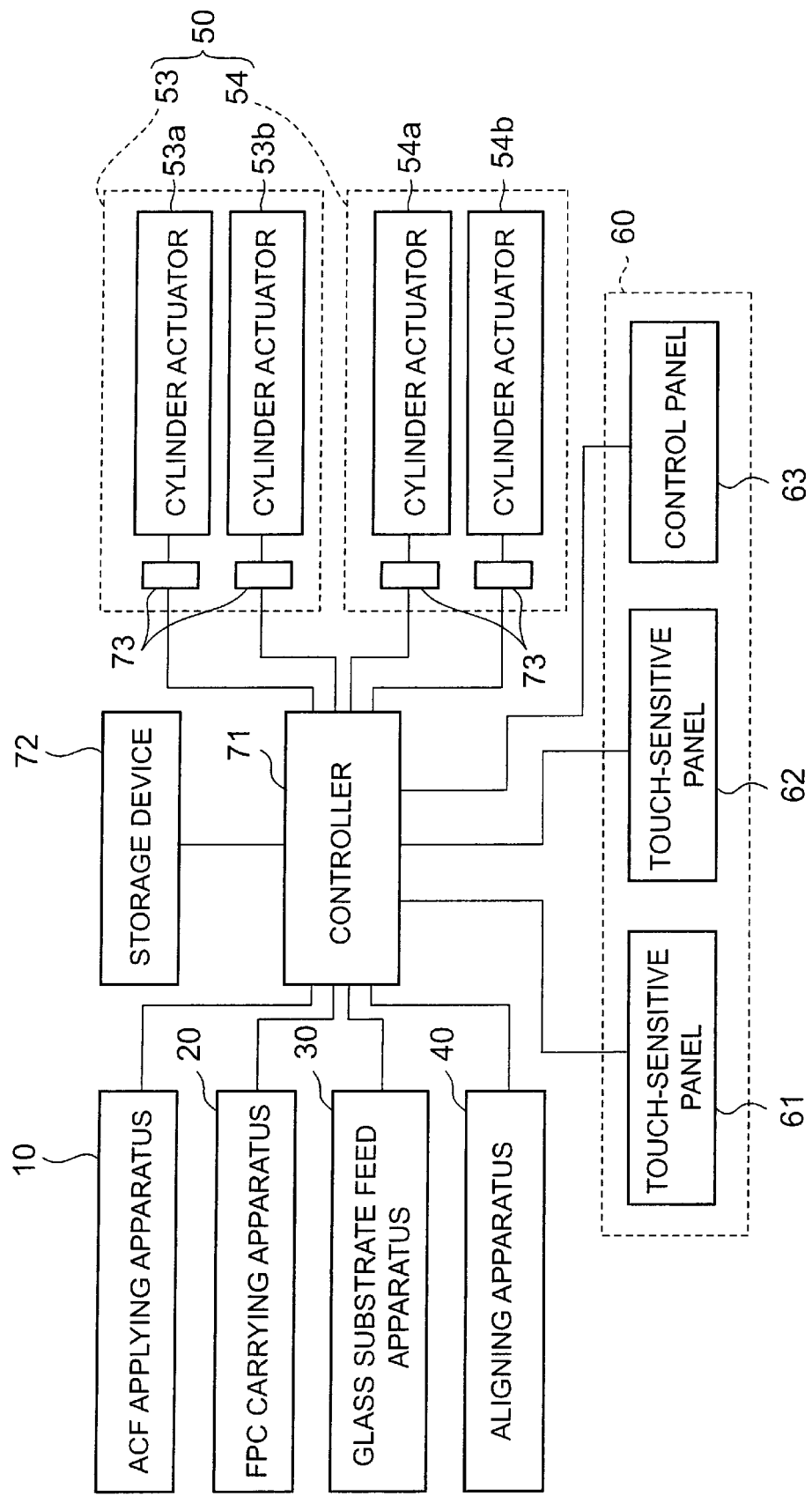
FIG. 5 is a block diagram of a control system for controlling the part mounting system shown in FIG. 1.

As shown in FIG. 5, a controller 71 controls the ACF applying apparatus 10, the FPC carrying apparatus 20, the glass substrate feed apparatus 30, the aligning apparatus 40, the first pressing device 53 and the second pressing device 54 (cylinder actuators 53a, 53b, 54a and 54b) of the bonding apparatus 50 and the man-machine interface apparatus 60 (touch-sensitive panels 61 and 62 and the control panel 63). A storage device 72 is connected to the controller 71. Electronic part mounting information is stored in the storage device 72. The electronic part mounting information includes data on the positions of FPCs on a glass substrate, a surface to which FPCs are to be bonded, i.e., the upper or the lower surface of the glass substrate to which FPCs are to be bonded, and the types of FPCs bonded at specified positions on a glass substrate and such.

Figure 6:
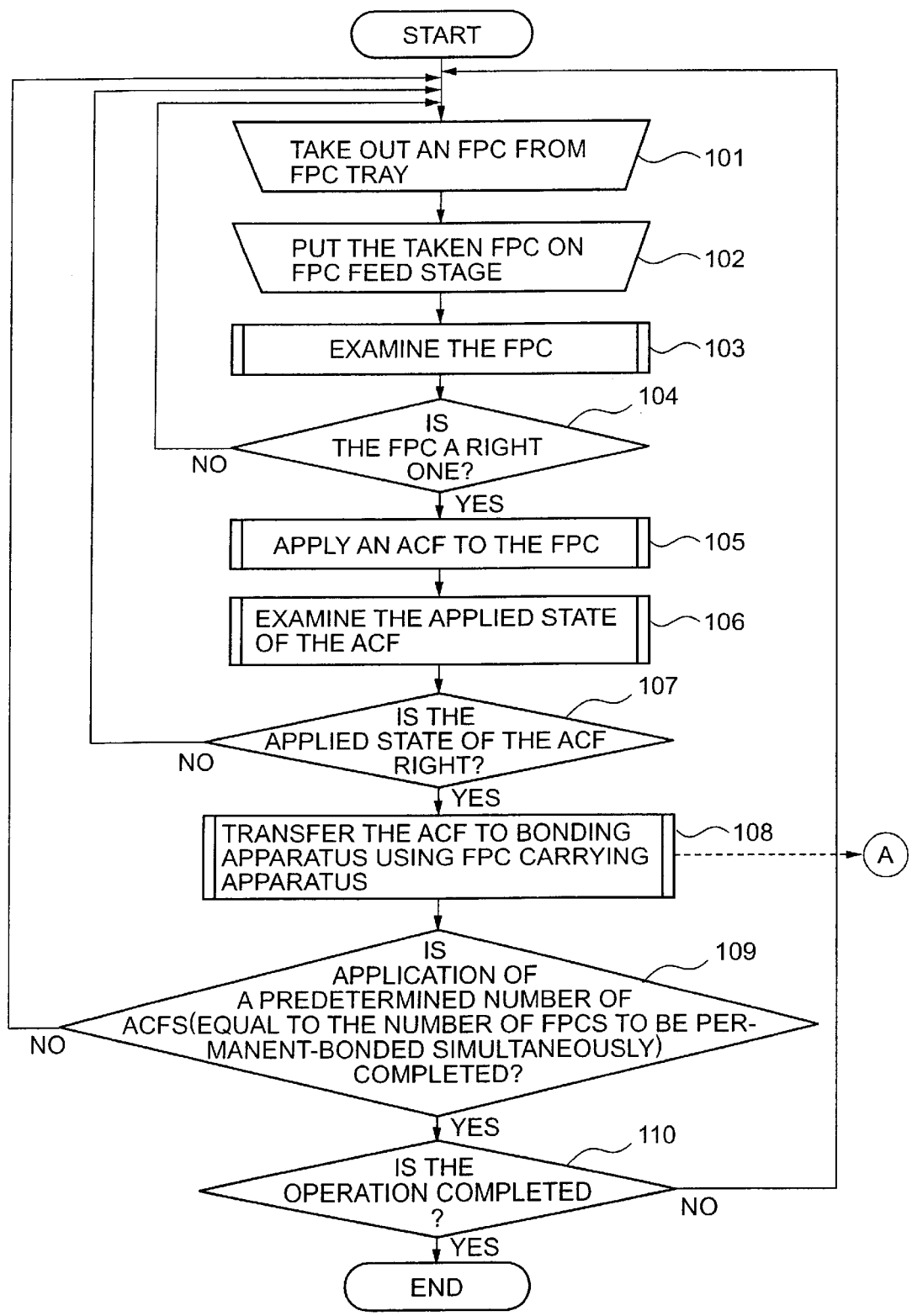
FIG. 6 is a flow chart of assistance in explaining the operation of the part mounting system shown in FIG. 1.
Figure 7:
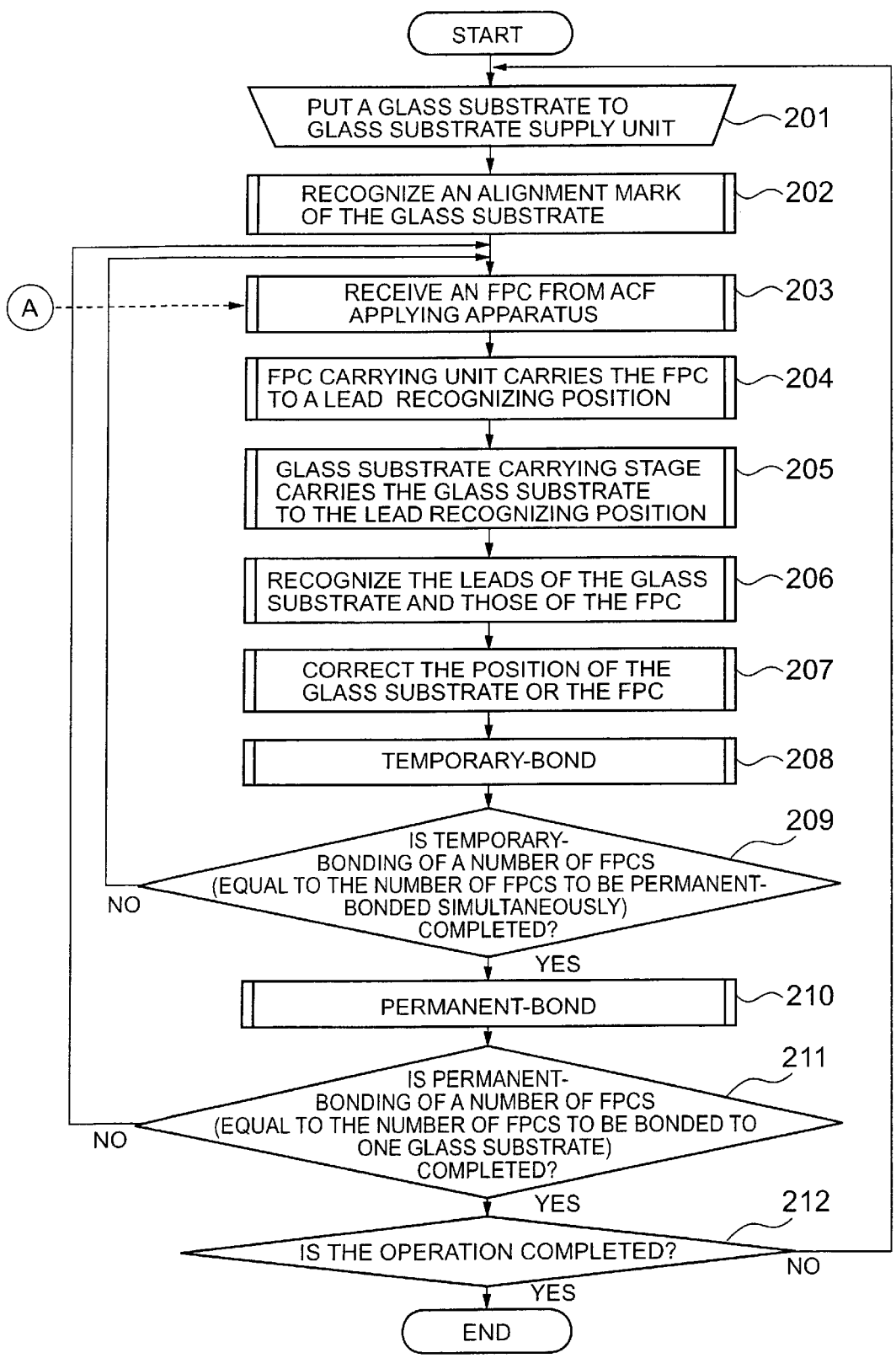
FIG. 7 is a flow chart of assistance in explaining the operation of the part mounting system shown in FIG. 1.

The operation of this embodiment will be described with reference to FIGS. 6 to 10. FIGS. 6 and 7 are flow charts of assistance in explaining the operation of the part mounting system shown in FIG. 1, and FIGS. 8 to 10 are timing charts of assistance in concretely explaining the operations shown in FIGS. 6 and 7.

Operations for Bonding ACFs to FPCs and Carrying FPCs

The operator enters an operation start instruction by operating the touch-sensitive panel 61. Then, the ACF applying unit 11 starts a preparatory operation for ACF application and the FPC feed stage 12 moves to an FPC supply position.

Then, the operator takes out an FPC identified by an FPC number displayed on the touch-sensitive panel 61 from an FPC tray, not shown (step 101) and puts the FPC taken out of the FPC tray on the FPC feed stage 12 (step 102). After fixing the FPC on the FPC feed stage 12 by suction, the operator enters an FPC feed instruction by operating the touch-sensitive panel 61.

Subsequently, the FPC feed stage 12 carries the FPC to the FPC identifying unit 13. The FPC identifying unit 13 inspects the FPC to see whether or not the FPC is the one indicated by the FPC number displayed on the touch-sensitive panel 61.

The FPC identifying unit 13 examines the type and condition of the FPC fed by the FPC feed stage 12 (step 103). If the FPC is a right one, the FPC feed stage 12 carries the FPC to the ACF applying unit 11 (step 104). If the FPC is a wrong one, the FPC feed stage 12 carries the FPC back to the FPC supply position (step 104).

An instruction requesting the replacement of the wrong FPC with a right one is displayed on the touch-sensitive panel 61. The operator replaces the wrong FPC with a right one, and enters an operation start instruction again by operating the touch-sensitive panel 61. The FPC identifying step is executed again.

Subsequently, the ACF applying unit 11 applies an ACF to the FPC fed by the FPC feed stage 12 (step 105).

After the ACF has been applied to the FPC by the ACF applying unit 11, the FPC feed stage 12 carries the FPC to the ACF application state examining unit 14.

The ACF application state examining unit 14 examines the state of the ACF applied to the FPC by the ACF applying unit 11 (step 106). If the state of the ACF on the FPC is right, the FPC feed stage 12 carries the FPC to an FPC transfer position (step 107). If the state of the ACF on the FPC is wrong, the FPC feed stage 12 returns the FPC to the FPC supply position (step 107).

In the latter case, the operator replaces the FPC to which the ACF has been wrongly applied with a new FPC and enters an FPC feed instruction again by operating the touch-sensitive panel 61. The FPC identifying step, the ACF applying step and the ACF application state examining step are executed again.

The FPC to which the ACF is applied correctly is transferred from the FPC feed stage 12 to the FPC transfer stage 22 by the FPC transfer arm 21 (step 108).

The FPC transfer stage 22 receives the FPC from the FPC transfer arm 21, moves to an FPC transfer position where the FPC is transferred to the FPC carrying unit 24. If one of the sides of the FPC to be facing down on the bonding apparatus 50 is facing up on the FPC transfer stage 22, the FPC is transferred from the FPC transfer stage 22 to the FPC inverting unit 23, and the FPC is transferred from the FPC inverting unit 23 to the FPC carrying unit 24 after being inverted.

More concretely, the controller 71 decides the position of the FPC relative to a glass substrate on the basis of electronic part mounting information stored in the storage device 72. If the FPC is to be bonded to the upper side of the glass substrate, the FPC inverting unit 23 inverts the FPC. If the FPC is to be bonded to the lower side of the glass substrate, the FPC inverting unit 23 does not operate. The FPC is inverted when the sane is to be bonded to the upper surface of the glass substrate to make the ACF applied to the upper side of the FPC by the ACF applying unit 11 face down.

The FPC thus transferred to the FPC carrying unit 24 is carried to the bonding apparatus 50 (aligning apparatus 40).

Steps 101 to 108 are repeated a number of times equal to the number of FPCs to be permanently bonded simultaneously to a glass substrate by the permanent-bonding unit or equal to the number of FPCs to be bonded to one glass substrate (step 109). Steps 101 to 109 are repeated until the operation of the part mounting system is completed (step 110).

Figure 8:
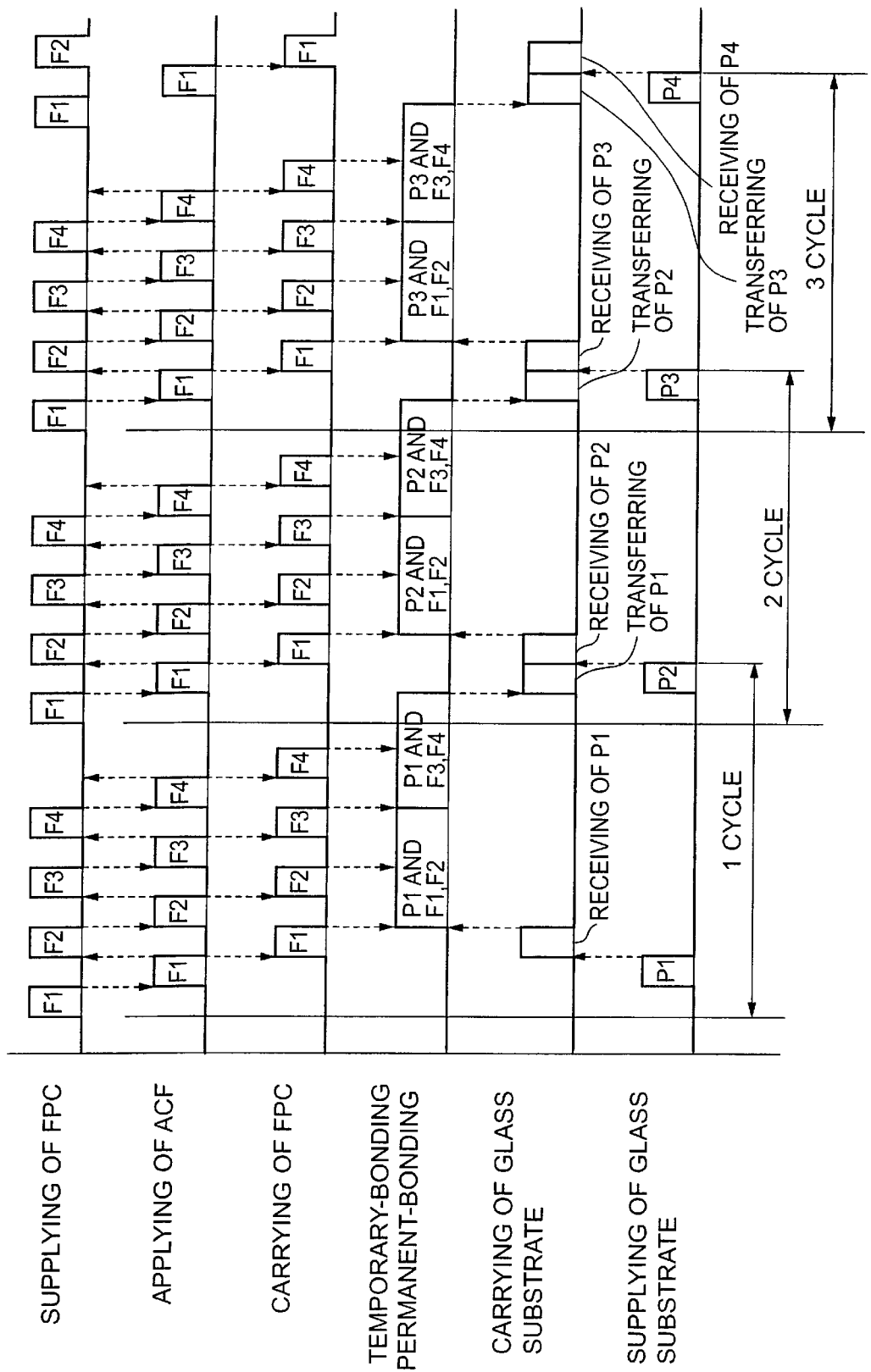
FIG. 8 is a timing chart of assistance in explaining the general operation of the part mounting system shown in FIG. 1.
Figure 9:
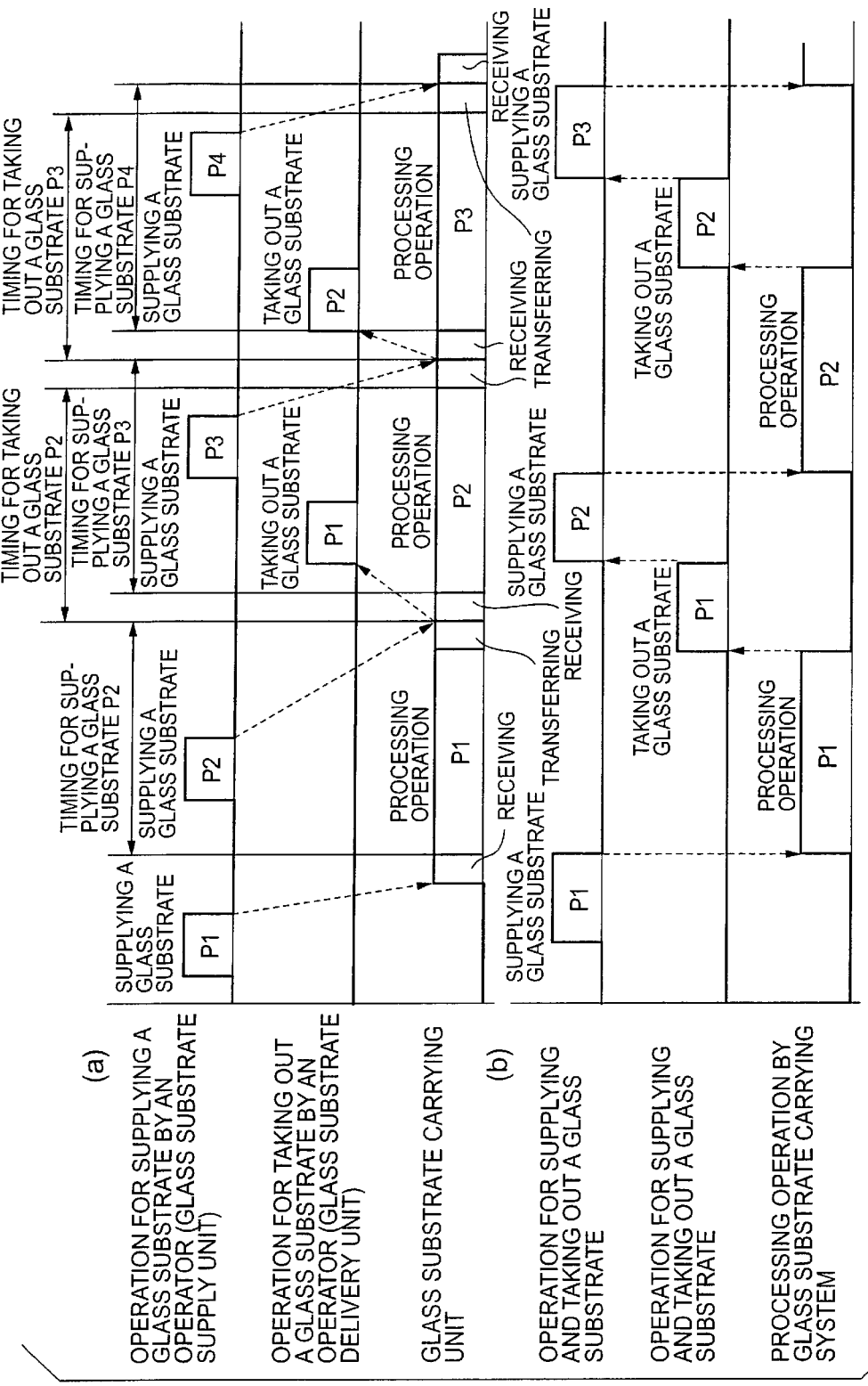
FIG. 9 is a timing chart of assistance in concretely explaining the operation of a glass substrate feed apparatus shown in FIG. 1.
Figure 10:
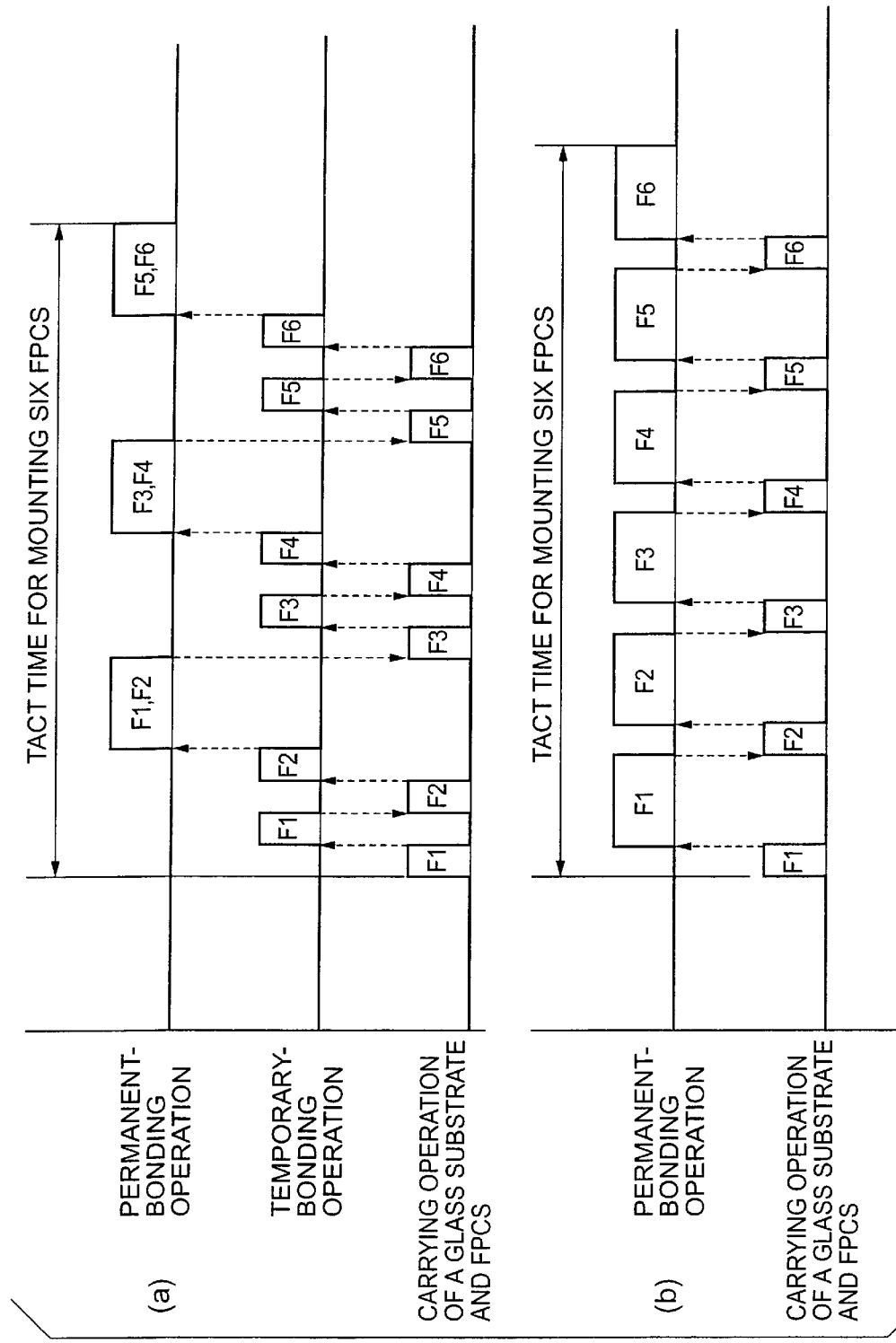
FIG. 10 is a timing chart of assistance in concretely explaining the operation of a bonding apparatus shown in FIG. 1.

When four FPCs are bonded to a glass substrate in two sets of two FPCs, the FPCs are fed, ACF are applied to the FPCs and the FPCs are carried by operations shown in FIG. 8. As shown in FIG. 8, operations for applying ACFs to FPCs and those for bonding the FPCs to the glass substrate (temporary bonding and permanent bonding) are carried out separately. While a glass substrate is in a bonding process for bonding FPCs to the glass substrate, FPCs to be bonded to another glass substrate can be prepared, so that the throughput of the part mounting system can be increased. In FIG. 8, a temporary bonding process and a permanent bonding process are shown in a single process for simplicity.

Glass Substrate Feeding

The operator takes out a glass substrate from a glass substrate carrier, not shown, and feeds the same to the glass substrate supply unit 31 (step 201). The operator positions the glass substrate on the glass substrate supply unit 31 by a glass substrate positioning device, not shown, and depresses a push button on the control panel 63 to notify the controller 71 of the completion of feeding the glass substrate.

The glass substrate fed to the glass substrate supply unit 31 is transferred from the glass substrate supply unit 31 to the glass substrate carrying stage 32 by lifting pins, not shown, included in the glass substrate carrying stage 32.

The glass substrate carrying stage 32 carries the glass substrate received from the glass substrate supply unit 31 to the bonding apparatus 50 (aligning apparatus 40). The glass substrate carrying stage 32 transfers the glass substrate provided with FPCs bonded thereto by the bonding apparatus 50 through a glass substrate transfer unit, not shown, to the glass substrate delivery unit 33. The operator takes out the glass substrate from the glass substrate delivery unit 33.

When bonding four FPCs in two sets of two FPCs to a glass substrate, the glass substrate is supplied, carried and returned as shown in FIGS. 8 and 9(a). Referring to FIGS. 8 and 9(a), operations for supplying and taking out a glass substrate are carried out separately from those for carrying a glass substrate. Therefore, while FPCs are being bonded to a glass substrate, another glass substrate can be supplied. Thus, a throughput that can be achieved by the part mounting system by carrying out a procedure shown in FIG. 9(a) is greater than that can be achieved by the part mounting system by carrying out a conventional procedure shown in FIG. 9(b).

Positioning of Glass Substrate and FPC

Upon the reception of a glass substrate, the glass substrate carrying stage 32 carries the glass substrate to an alignment mark recognizing position on the aligning apparatus 40 to position the glass substrate by an image processing operation. The aligning apparatus 40 forms an alignment mark image of an alignment mark formed on the glass substrate carried thereto by the glass substrate carrying stage 32 by the image pickup device 41, and an image processing device, not shown, recognizes the position of the glass substrate from the alignment mark image formed by the image pickup device 41 (step 202).

When an FPC is transferred from the ACF applying apparatus 10 to the FPC carrying apparatus 20 (step 203), the FPC carrying unit 24 of the FPC carrying apparatus 20 carries the FPC to a lead recognizing position on the aligning apparatus 40 to position the FPC relative to the glass substrate by image processing (step 204).

Then, the controller 71 corrects the position of the glass substrate carrying stage 32 with reference to the position of the glass substrate recognized by the image processing device in step 202 and carries the glass substrate to the lead recognizing position on the aligning apparatus 40 (step 205).

An image of the leads of the glass substrate and the FPC carried to the lead recognizing position on the aligning apparatus 40 is formed by the image pickup device 41, and the positional relation between the leads of the glass substrate and those of the FPC is recognized by an image processing device, not shown (step 206). Then, the controller 71 corrects the position of the FPC carrying unit 24 with reference to the positional relation between the glass substrate and the FPC recognized by the image processing device to align the FPC with the glass substrate (step 207).

When the FPC cannot be correctly recognized by the image processing operation for processing the image of the glass substrate and the FPC placed in the aligning apparatus 40, and the image processing device or the operator decides that the FPC is defective, it is preferable to carry away the FPC by the FPC feed table 25 and to supply a right FPC of the same type. The operator supplies the right FPC to the FPC feed table 25 after taking out the rejected FPC from the FPC feed table 25. The FPC thus supplied must be provided with an ACF.

Bonding FPC to Glass Substrate

After the FPC has been thus aligned with the glass substrate, the FPC is bonded temporarily through the ACF to the glass substrate by the temporary-bonding unit 51 (step 208)

Steps 203 to 208 are repeated a number of times equal to the number of FPCs to be permanently bonded simultaneously to a glass substrate by the permanent-bonding unit 52 (step 209). After the predetermined number of FPCs have been temporarily bonded to the glass substrate, the glass substrate carrying stage 32 carries the glass substrate to the permanent-bonding unit 52. The permanent-bonding unit 52 bonds the FPCs temporarily bonded to the glass substrate simultaneously to the glass substrate for permanent bonding (step 210).

Steps 201 to 210 are repeated until all the FPCs temporarily bonded to the glass substrate are bonded permanently to the glass substrate (step 211). Steps 201 to 211 are repeated until the operation of the part mounting system is completed (step 212).

The controller 71 of the part mounting system selects either the first pressing device 53 or the second pressing device 54 on the basis of electronic part mounting information stored in the storage device 72 for temporary bonding and permanent bonding, and controls the operations of the cylinder actuators 53a and 53b and the cylinder actuators 54a and 54b according to the result of selection. When the FPCs are to be bonded to the upper surface of the glass substrate, the lower tool 56 is used for supporting the glass substrate and the upper tool 55 is used for bonding. When the FPCs are to be bonded to the lower surface of the glass substrate, the upper tool 55 is used for supporting the glass substrate and the lower tool 56 is used for bonding.

When bonding six FPCs in two sets of two FPCs to one glass substrate, the FPCs are bonded temporarily and permanently to the glass substrate by a bonding procedure shown in FIG. 10(a). Referring to FIG. 10(a), the temporary-bonding unit 51 temporarily bonds two FPCs successively to the glass substrate, and then the permanent-bonding unit 52 carries out a permanent-bonding process to bond the two FPCs temporarily bonded to the glass substrate simultaneously to the glass substrate for permanent bonding. Thus, the number of cycles of the permanent-bonding process, which takes more time than a temporary-bonding process, can be reduced. Thus, a throughput that can be achieved by the part mounting system by carrying out the bonding procedure shown in FIG. 10(a) is greater than that can be achieved by the part mounting system by carrying out a conventional bonding procedure shown in FIG. 10(b).

In this embodiment, the temporary-bonding unit 51 bonds a plurality of FPCs successively to a glass substrate, and then the permanent-bonding unit 52 bonds the FPCs temporarily bonded to the glass substrate simultaneously for permanent bonding. Consequently, the number of cycles of the permanent-bonding process for each glass substrate can be reduced, which increases the throughput of the part mounting system.

In this embodiment, the temporary-bonding unit 51 or the permanent-bonding unit 52 is provided with the pair of pressing devices to press a glass substrate and a FPC from above and from below the same, and the pair of pressing devices are used selectively for applying either the bonding pressure or the backup pressure. Thus, FPCs can be bonded to both the surfaces of a glass substrate by using the pair of pressing devices, which reduces floor space necessary for installing the part mounting system.

In this embodiment, pressures to be applied to the cylinder actuators 53a and 53b and the cylinder actuators 54a and 54b of each of the temporary-bonding unit 51 and the permanent-bonding unit 52 are adjusted to proper pressures for temporary bonding and permanent bonding by the pressure adjusting devices 73 according to the type of FPC and the number of FPCs to be simultaneously bonded to the glass substrate for permanent bonding.

In this embodiment, the controller 71 inverts the FPCs selectively according to the electronic part mounting information stored in the storage device 72 to feed the FPCs to the bonding apparatus 50 in positions corresponding to the positions of the FPCs on the glass substrate. Thus, desired FPCs can be surely bonded to desired portions of the glass substrate.

In this embodiment, the controller 71 uses either the first pressing device 53 or the second pressing device 54 selectively for bonding according to the electronic part mounting information stored in the storage device 72. Thus, the first pressing device 53 and the second pressing device 54 are able to apply pressures suitable for the surfaces of the glass substrate to which the FPCs are bonded, so that the FPCs can be satisfactorily bonded to the glass substrate.

In the foregoing embodiment, the FPC is bonded to the glass substrate after applying the ACF to the FPC by the ACF applying apparatus 10. The FPC may be bonded to the glass substrate after applying the ACF to the glass substrate.

In the foregoing embodiment, the glass substrate carrying stage 32 is provided with the FPC support mechanism for supporting FPCs bonded to the glass substrate. The temporary-bonding unit 51 and the permanent-bonding unit 52 may be provided with such an FPC support mechanism as that included in the glass substrate carrying stage 32.

Although the present invention has been described as applied to the manufacture of a liquid crystal display, the present invention is not limited thereto in its practical application and is applicable to the manufacture of panel-shaped display devices, such as plasma display panels. In the foregoing description of the preferred embodiment, electronic parts are FPCs and connecting members are ACFs, naturally, electronic parts and connecting members may be those other than FPCs and ACFs.

The present invention is applied to both the temporary-bonding unit 51 and the permanent-bonding unit 52 in the foregoing embodiment, the present invention may be applied only to either the temporary-bonding unit 51 or the permanent-bonding unit 52.

What is claimed is:

1. A part mounting system comprising:
    an electronic part carrying apparatus that carries an electronic part;
    a substrate feed apparatus that feeds a substrate;

an aligning apparatus that aligns the electronic part carried by the electronic part carrying apparatus and the substrate fed by the substrate feed apparatus; and a bonding apparatus that bonds the electronic part aligned with the substrate to the substrate by pressing;

wherein the bonding apparatus includes a first pressing unit that presses the electronic part against an upper surface of the substrate from above the substrate, and a second pressing unit that presses the electronic part against a lower surface of the substrate from below the substrate, each of the first and the second pressing unit has a tool that is applied to the substrate and the electronic part, and a pressure applying device that selectively applies a bonding pressure or a backup pressure to the tool, the electronic part carrying apparatus carries the electronic part to a position above the substrate when the electronic part is bonded to the upper surface of the substrate, whereas the electronic part carrying apparatus carries the electronic part to a position below the substrate when the electronic part is bonded to the lower surface of the substrate.

2. The part mounting system according to claim 1, further comprising:

a storage device that stores electronic part mounting information; and a controller that selects either the first pressing device or the second pressing device for bonding on the basis of the electronic part mounting information stored in the storage device, and controls the pressure applying device to apply a bonding pressure to the tool of one of the first and the second pressing device, selected as a bonding means and applies a backup pressure to the other pressing device.

3. The part mounting system according to claim 1, wherein the substrate feed apparatus is provided with a support mechanism that supports electronic parts bonded to a substrate by the bonding apparatus.

4. A part mounting system comprising:

an electronic part carrying apparatus that carries an electronic part;

a substrate feed apparatus that feeds a substrate;

an aligning apparatus that aligns the electronic part carried by the electronic part carrying apparatus and the substrate fed by the substrate feed apparatus; and a bonding apparatus that bonds the electronic part aligned with the substrate to the substrate by pressing;

wherein the bonding apparatus includes a first pressing unit that presses the electronic part against an upper surface of the substrate from above the substrate, and a second pressing unit that presses the electronic part against a lower surface of the substrate from below the substrate, each of the first and the second pressing unit has a tool that is applied to the substrate and the electronic part, and a pressure applying device that selectively applies a bonding pressure or a backup pressure to the tool, the pressure applying device includes a pair of lifting devices that apply the bonding pressure or the backup pressure to the tool, and a pressure adjusting device that adjusts a pressure to be exerted by the lifting devices on the tool.

5. A part mounting system comprising:

an electronic part carrying apparatus that carries an electronic part;

a substrate feed apparatus that feeds a substrate;

an aligning apparatus that aligns the electronic part carried by the electronic part carrying apparatus and the substrate fed by the substrate feed apparatus;

a bonding apparatus that bonds the electronic part aligned with the substrate to the substrate by pressing;

an inverting mechanism that inverts the electronic part to be carried by the electronic part carrying apparatus;

a storage device that stores electronic part mounting information; and a controller that controls the inverting mechanism so as to invert the electronic part selectively on the basis of the electronic part mounting information;

wherein the bonding apparatus includes a first pressing unit that presses the electronic part against an upper surface of the substrate from above the substrate, and a second pressing unit that presses the electronic part against a lower surface of the substrate from below the substrate, each of the first and the second pressing unit has a tool that is applied to the substrate and the electronic part, and a pressure applying device that selectively applies a bonding pressure or a backup pressure to the tool.

6. A part mounting system comprising:

an electronic part carrying apparatus that carries an electronic part;

a substrate feed apparatus that feeds a substrate;

an aligning apparatus that aligns the electronic part carried by the electronic part carrying apparatus and the substrate fed by the substrate feed apparatus;

a bonding apparatus that bonds the electronic part aligned with the substrate to the substrate by pressing;

a storage device that stores electronic part mounting information;

an inverting mechanism that inverts the electronic part to be carried by the electronic part carrying apparatus; and a controller that selects either the first pressing device or the second pressing device for bonding on the basis of the electronic part mounting information stored in the storage device, and controls the pressure applying device to apply a bonding pressure to the tool of one of the first and the second pressing device, selected as a bonding means and applies a backup pressure to the other pressing device;

wherein the bonding apparatus includes a first pressing unit that presses the electronic part against an upper surface of the substrate from above the substrate, and a second pressing unit that presses the electronic part against a lower surface of the substrate from below the substrate, each of the first and the second pressing unit has a tool that is applied to the substrate and the electronic part, and a pressure applying device that selectively applies the bonding pressure or the backup pressure to the tool, the controller further controls the inverting mechanism so as to invert the electronic part selectively on the basis of the electronic part mounting information.

7. A part mounting system comprising:

an electronic part carrying apparatus that carries an electronic part;

a connecting member applying apparatus that applies a connecting member to the electronic part carried by the electronic part carrying apparatus;

an electronic part carrying apparatus that carries the electronic part to which the connecting member has been applied by the connecting member applying apparatus;

a substrate feed apparatus that feeds a substrate;

an aligning apparatus that aligns the electronic part carried by the electronic part carrying apparatus and the substrate fed by the substrate feed apparatus;

a temporary bonding apparatus that temporarily bonds together the electronic part and the substrate aligned with each other by the aligning apparatus through the connecting member applied to the electronic part; and a permanent bonding apparatus that permanently bonds the electronic part temporarily bonded to the substrate by the temporary bonding apparatus to the substrate;

wherein the temporary bonding apparatus incldes a first pressing unit that presses the electronic part against an upper surface of the substrate from above the substrate, and a second pressing unit that presses the electronic part against a lower surface of the substrate from below the substrate, and each of the first and the second bonding unit has a tool that is applied to the substrate and the electronic part, and a pressure applying device that selectively applies a bonding pressure or a backup pressure to the tool.

8. The part mounting system according to claim 7, wherein the pressure applying device includes a pair of lifting devices that apply the bonding pressure or the backup pressure to the tool, and a pressure adjusting device that adjusts a pressure to be exerted by the lifting devices on the tool.

9. The part mounting system according to claim 7, further comprising:

a storage device that stores electronic part mounting information; and a controller that selects either the first pressing device or the second pressing device for bonding on the basis of the electronic part mounting information stored in the storage device, and controls the pressure applying device to apply a bonding pressure to the tool of one of the first and the second pressing device, selected as a bonding means and applies a backup pressure to the other pressing device.

10. The part mounting system according to claim 7, further comprising:

an inverting mechanism that inverts an electronic part to be carried by the electronic part carrying apparatus;

a storage device that stores electronic part mounting information; and a controller that controls the inverting mechanism so as to invert an electronic part selectively on the basis of the electronic part mounting information.

11. The part mounting system according to claim 7, further comprising:

a storage device that stores electronic part mounting information;

an inverting mechanism that inverts an electronic part to be carried by the electronic part carrying apparatus; and a controller that selects either the first pressing device or the second pressing device for bonding on the basis of the electronic part mounting information stored in the storage device, and controls the pressure applying device to apply a bonding pressure to the tool of one of the first and the second pressing device, selected as a bonding means and applies a backup pressure to the other pressing device;

wherein the controller further controls the inverting mechanism so as to invert an electronic part selectively on the basis of the electronic part mounting information.

12. The part mounting system according to claim 7, wherein the substrate feed apparatus is provided with a support mechanism that supports electronic parts bonded to a substrate by the bonding apparatus.

13. A part mounting method comprising the steps of:

feeding an electronic part;

feeding a substrate;

aligning the fed electronic part and the fed substrate; and bonding the electronic part aligned with the substrate through a connecting member to the substrate;

wherein the step of bonding the electronic part to the substrate includes the steps of:

selecting either a first pressing unit that presses the electronic part against an upper surface of the substrate from above the substrate or a second pressing unit that presses the electronic part against a lower surface of the substrate from below the substrate to bond the electronic part to the substrate on the basis of electronic part mounting information stored in a storage device; and applying a bonding pressure to a tool included in the pressing unit selected for bonding the electronic part to the substrate and applying a backup pressure to a tool included in the other bonding unit.

14. A part mounting system comprising:

an electronic part carrying apparatus that carries an electronic part;

a substrate feed apparatus that feeds a substrate;

an aligning apparatus that aligns the electronic part carried by the electronic part carrying apparatus and the substrate fed by the substrate feed apparatus;

a temporary-bonding apparatus that temporarily bonds together the electronic part aligned and the substrate aligned with each other by the aligning apparatus through a connecting member; and a permanent bonding apparatus that permanently bonds the electronic part temporarily bonded to the substrate by the temporary-bonding apparatus to the substrate;

wherein the temporary-bonding apparatus includes a first pressing unit that presses the electronic part against an upper surface of the substrate from above the substrate, and a second pressing unit that presses the electronic part against a lower surface of the substrate from below the substrate, and each of the first and the second bonding unit has a tool that is applied to the substrate and the electronic part, and a pressure applying device that selectively applies a bonding pressure or a backup pressure to the tool.

* * * * *